United States Patent
Zhang et al.

(10) Patent No.: US 9,812,365 B1
(45) Date of Patent: Nov. 7, 2017

(54) METHODS OF CUTTING GATE STRUCTURES ON TRANSISTOR DEVICES

(71) Applicant: GLOBALFOUNDRIES Inc., Grand Cayman (KY)

(72) Inventors: John H. Zhang, Altamont, NY (US); Haigou Huang, Rexford, NY (US); Xusheng Wu, Ballston Lake, NY (US); Ruilong Xie, Niskayuna, NY (US); Stan Tsai, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/286,117

(22) Filed: Oct. 5, 2016

(51) Int. Cl.
 *H01L 21/8234* (2006.01)
 *H01L 21/02* (2006.01)
 *H01L 29/66* (2006.01)
 *H01L 21/311* (2006.01)
 *H01L 21/3105* (2006.01)

(52) U.S. Cl.
 CPC .. *H01L 21/823437* (2013.01); *H01L 21/0217* (2013.01); *H01L 21/02164* (2013.01); *H01L 21/31056* (2013.01); *H01L 21/31144* (2013.01); *H01L 29/66545* (2013.01)

(58) Field of Classification Search
 CPC combination set(s) only.
 See application file for complete search history.

(56) References Cited

U.S. PATENT DOCUMENTS

| | | | | |
|---|---|---|---|---|
| 9,412,616 | B1* | 8/2016 | Xie | H01L 21/76224 |
| 2014/0027820 | A1* | 1/2014 | Aquilino | H01L 21/76232 |
| | | | | 257/288 |
| 2014/0191324 | A1* | 7/2014 | Cai | H01L 29/785 |
| | | | | 257/368 |
| 2015/0340457 | A1* | 11/2015 | Xie | H01L 29/66545 |
| | | | | 257/288 |
| 2017/0018628 | A1* | 1/2017 | Greene | H01L 29/66621 |

* cited by examiner

*Primary Examiner* — Mamadou Diallo
(74) *Attorney, Agent, or Firm* — Amerson Law Firm, PLLC

(57) ABSTRACT

One illustrative method disclosed includes, among other things, forming a plurality of gates above a substrate, each of the gates comprising a gate structure and a first layer of a first insulating material positioned on an upper surface of the gate structure, and forming a second layer of a second insulating material above insulating material positioned above the substrate between the laterally spaced apart gates, wherein the first insulating material and the second insulating material are selectively etchable relative to one another. The method may also include selectively removing a portion of the first layer to thereby expose a portion of the gate structure of at least one of the gates, selectively removing the exposed portion of the gate structure so as to thereby define a gate-cut cavity, and forming an insulating gate-cut structure in the gate-cut cavity.

18 Claims, 16 Drawing Sheets

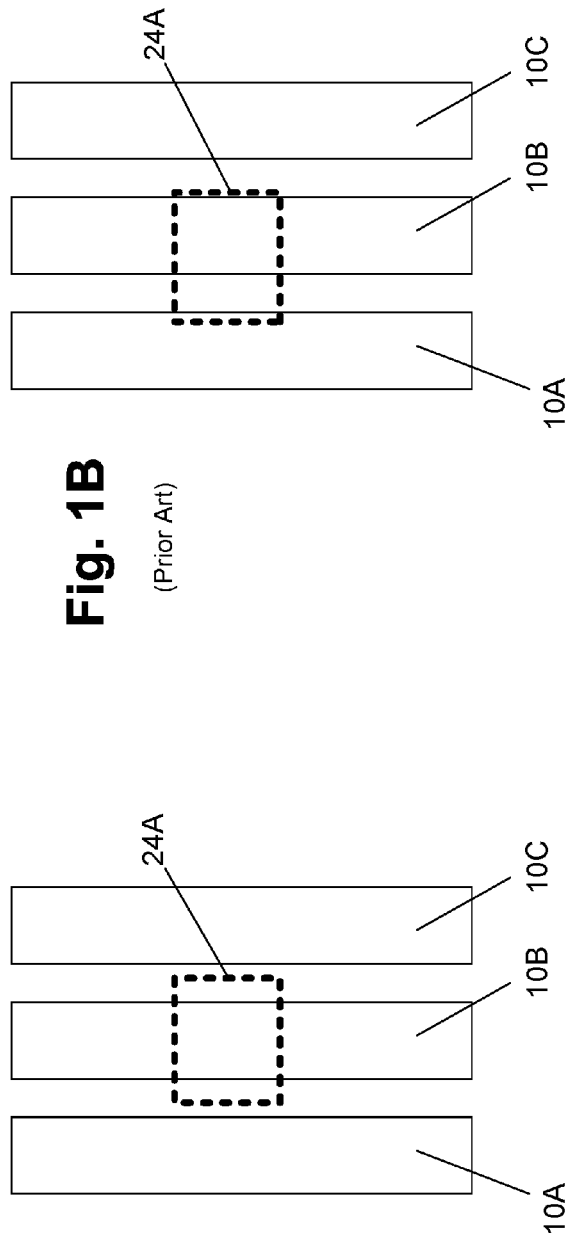
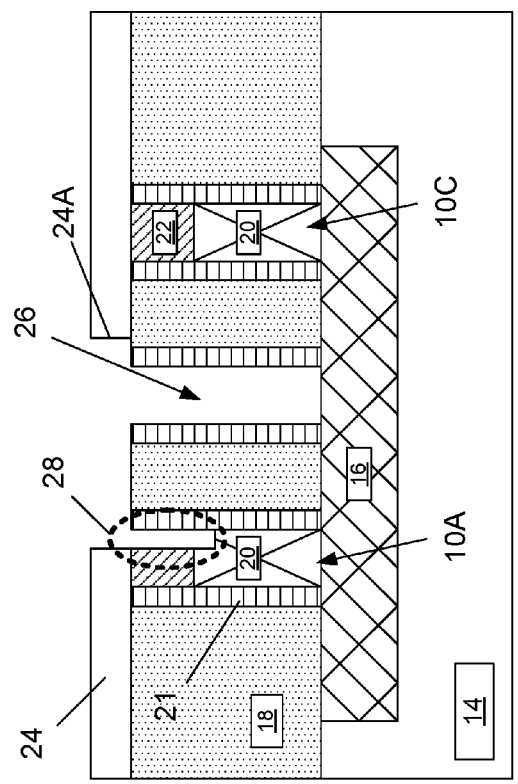
Fig. 1A (Prior Art)
Fig. 1B (Prior Art)
Fig. 1C (Prior Art)

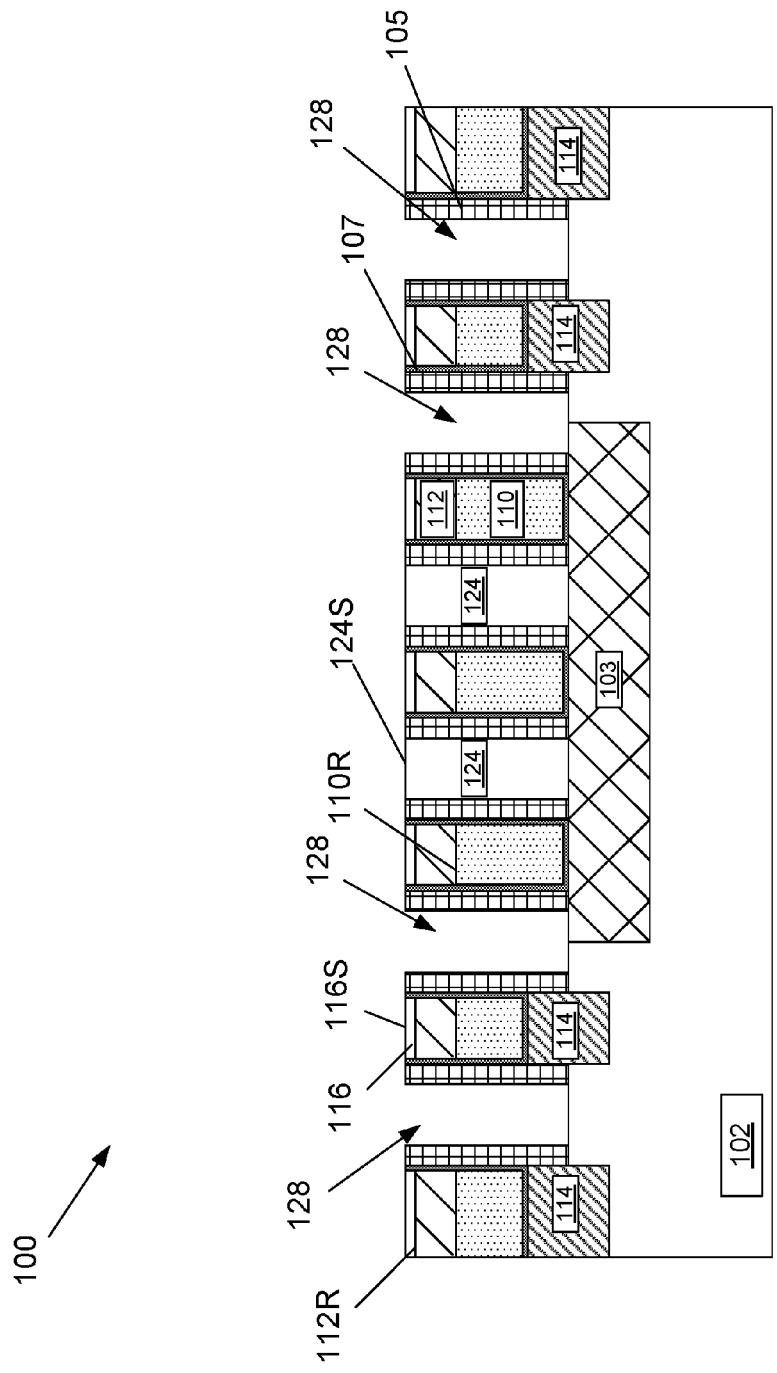

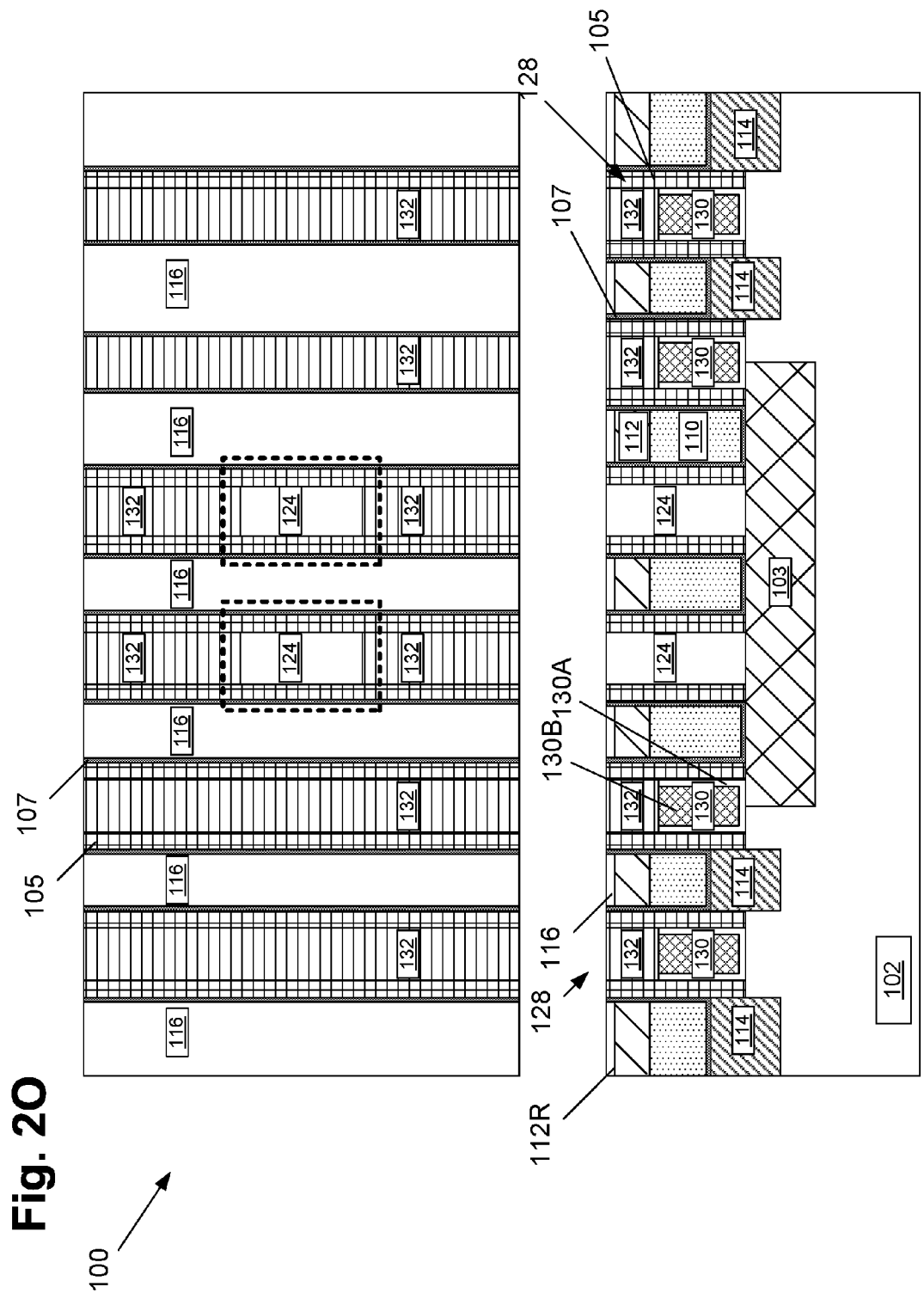

METHODS OF CUTTING GATE STRUCTURES ON TRANSISTOR DEVICES

BACKGROUND OF THE INVENTION

1. Field of the Invention

The present disclosure generally relates to the fabrication of integrated circuits, and, more particularly, to various methods of cutting gate structures on transistor devices.

2. Description of the Related Art

In modern integrated circuits, such as microprocessors, storage devices and the like, a very large number of circuit elements, especially field effect transistors (FETs), are provided and operated on a restricted chip area. FETs come in a variety of different configurations, e.g., planar transistor devices, FinFET transistor devices, etc. These FET devices are typically operated in a switched mode, that is, these devices exhibit a highly conductive state (on-state) and a high impedance state (off-state). The state of the field effect transistor is controlled by a gate electrode, which controls, upon application of an appropriate control voltage, the conductivity of a channel region formed between a drain region and a source region. In addition to transistors, which is an example of an active circuit element or semiconductor device, an integrated circuit product also includes passive circuit elements such as, for example, resistors, capacitors, etc.

For many FET devices, the gate structures are initially formed as continuous line-type structures that extend across the entire substrate, including across both active regions and isolation regions. These gate structures may be final gate structures for the FET devices (a so-called "gate-first" manufacturing technique) or they may be sacrificial gate structures when the final gate structures for the FET devices are formed using replacement gate manufacturing techniques. The long continuous line-type gate structures are formed by depositing the materials for the gate structures across the entire substrate, forming a patterned gate etch mask above the deposited gate materials and performing one or more etching processes through the patterned gate etch mask to remove the exposed portions of the gate materials. At that point, a spacer structure will be formed adjacent the long continuous line-type gate structures. At some point after other processing has occurred, e.g., formation of epi material in the source/drain regions of the devices, portions of the long continuous line-type gate structures will be removed or "cut" so as to define remaining portions or segments of the original long continuous line-type gate structures, wherein the segments will function as final gate structure (gate-first technique) or sacrificial gate structures (replacement gate technique).

FIGS. 1A-1C depict some problems that may be encountered when performing at least one prior art gate-cut processing technique. Depicted therein are three illustrative gate structures 10A-10C wherein it is desired to remove or "cut" a portion of the middle gate 10B. FIG. 1C is a cross-sectional view showing the three gates 10A-C positioned above an isolation region 16 defined in the substrate 14. Also depicted are illustrative gate structures 20 (comprised of a gate insulation layer and a gate electrode layer), sidewall spacers 21, gate caps 22, a layer of insulating material 18 and a patterned "gate cut" masking layer 24 with an opening 24A defined therein. FIG. 1A depicts the situation wherein the opening 24A is perfectly aligned over the middle gate 10B, i.e., the opening 24A does not expose any portion of the adjacent gate structures 10A or 10C. However, as gate pitch dimensions are continuously decreasing, it is very difficult and expensive to achieve the perfect alignment of the gate cut mask 24 as depicted in FIG. 1A, i.e., there is a very small process window for properly positioning the opening 24A in the gate cut mask 24 at the desired location. As shown in FIG. 1B, in some cases, due to a variety of factors, the opening 24A in the gate cut mask 24 is misaligned such that the opening 24A exposes a portion of an adjacent gate structure, i.e., the gate structure 10A. FIG. 1C is a cross-sectional view depicting the product wherein the gate cut mask 24 is misaligned (as depicted in FIG. 1B) after an etching process was performed to remove the portions of the gate 10B exposed by the gate cut mask 24, thereby defining an opening 26 where the gate 10B was cut. Due to the misalignment of the gate cut mask 24, the gate cap 22 on the gate 10A and the gate structure 20 on the gate 10A may also be attacked during the etching process, as depicted in the dashed line region 28. If the gate structure 20 on the gate 10A is subjected to significant attack, significant gouging, the gate structure 20 may not work for its intended purpose, or at least not as well as intended, and production yields may suffer. Some prior art techniques that have been performed in an attempt to prevent gouging of the gate structure 20 of the gate 10A have included forming a separate silicon nitride structure (not shown)—sometimes referred to as a "divot-fill" in the space adjacent the partially removed gate cap 22 and above the gate structure 20 prior to performing the etching process to remove the gate structure 20 from the gate 10B. Such additional processing steps are time-consuming and expensive.

The present disclosure is directed to various methods of cutting gate structures on transistor devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various novel methods of cutting gate structures on transistor devices. One illustrative method disclosed includes, among other things, forming a plurality of laterally spaced apart continuous line-type gates above a semiconductor substrate, each of the gates comprising a gate structure and a first layer of a first insulating material positioned on an upper surface of the gate structure, and forming a second layer of a second insulating material above insulating material positioned above the substrate between the laterally spaced apart gates, wherein the first insulating material and the second insulating material are selectively etchable relative to one another. In this example, the method may also include performing at least one first etching process to selectively remove a portion of the first layer relative to portions of the second layer so as to thereby expose a portion of an axial length of the gate structure of the at least one of the plurality of gates, performing at least one second etching process to selectively remove the exposed axial portion of the gate structure of the at least one of the plurality of gates so as to thereby define a gate-cut cavity and forming an insulating gate-cut structure in the gate-cut cavity.

BRIEF DESCRIPTION OF THE DRAWINGS

The disclosure may be understood by reference to the following description taken in conjunction with the accompanying drawings, in which like reference numerals identify like elements, and in which:

FIGS. 1A-1C depict various illustrative prior art techniques for cutting a portion of gate structures for an integrated circuit product.

Figure 2A:
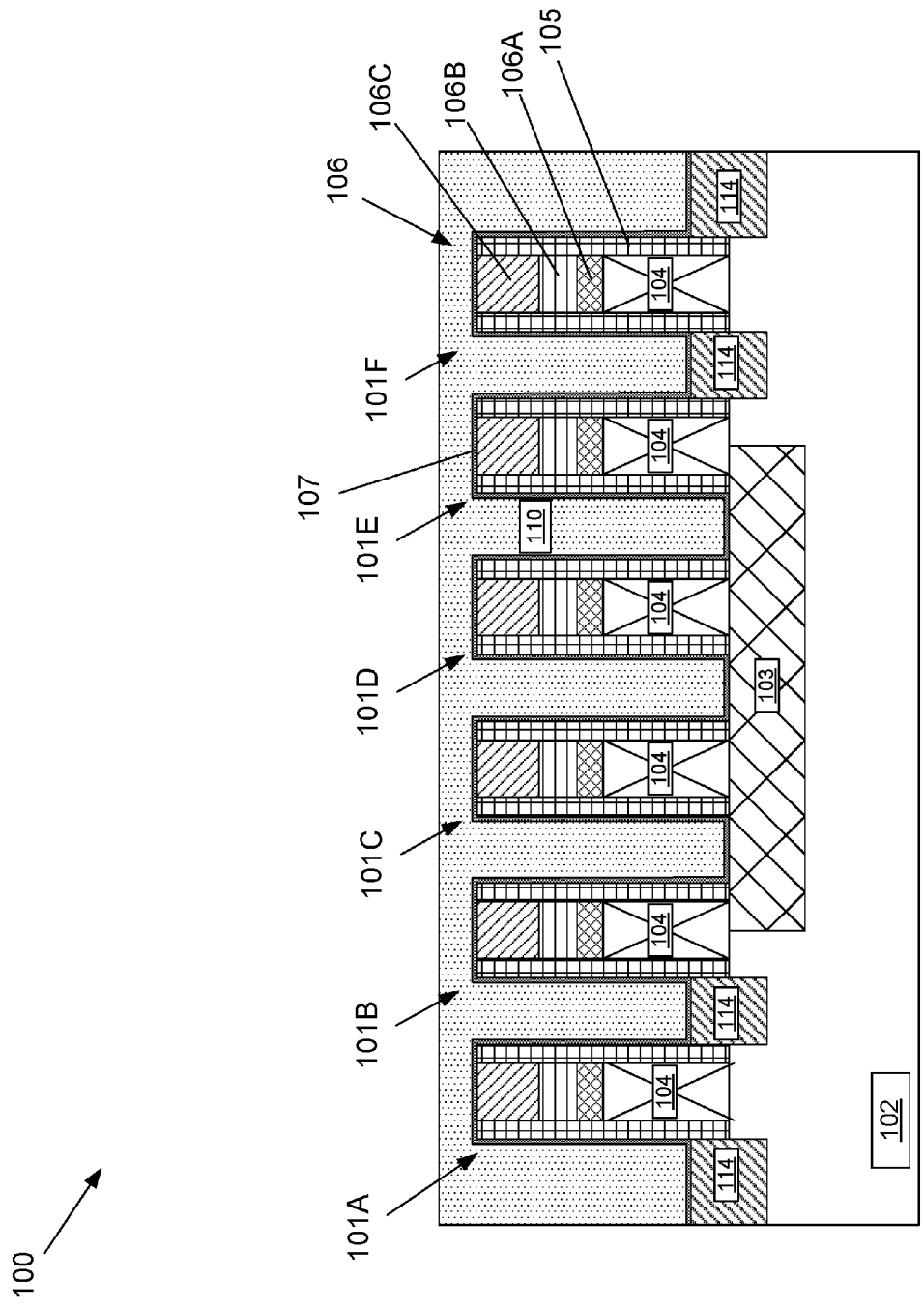
FIGS. 2A-2O depict various novel methods disclosed herein for cutting gate structures on transistor devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The methods and devices disclosed herein may be employed in manufacturing products using a variety of technologies, e.g., NMOS, PMOS, CMOS, etc., and they may be employed in manufacturing a variety of different integrated circuit products, e.g., memory products, logic products, ASICs, etc. As will be appreciated by those skilled in the art after a complete reading of the present application, the inventions disclosed herein may be employed in forming integrated circuit products using transistor devices in a variety of different configurations, e.g., planar devices, FinFET devices, etc. Thus, the presently disclosed inventions should not be considered to be limited to any particular form of transistors. Of course, the inventions disclosed herein should not be considered to be limited to the illustrative examples depicted and described herein. With reference to the attached figures, various illustrative embodiments of the methods and devices disclosed herein will now be described in more detail. The various layers of material described below may be formed by any of a variety of different known techniques, e.g., a chemical vapor deposition (CVD) process, an atomic layer deposition (ALD) process, a thermal growth process, spin-coating techniques, etc. Moreover, as used herein and in the attached claims, the word "adjacent" is to be given a broad interpretation and should be interpreted to cover situations where one feature actually contacts another feature or is in close proximity to that other feature.

FIGS. 2A-2O depict various novel methods disclosed herein for methods of cutting gate structures on transistor devices for an integrated circuit (IC) product 100. The product 100 is formed in and above a semiconductor substrate 102. In the depicted example, the IC product 100 comprises six illustrative laterally spaced apart continuous line-type gates 101A-F (collectively referenced using the numeral 101) that were formed above the substrate 102. In the depicted example, the gates 101 comprise a sacrificial gate structure 104 and portions of a patterned gate-cut mask 106 (including a first layer 106A) positioned above the sacrificial gate structure 104. As depicted, the continuous line-type gates 101 are essentially continuous line-type structures that have been formed across the entire substrate 102. As shown, portions of the gates 101C, 101D are positioned vertically above an isolation region 103, e.g., silicon dioxide, that was formed in the substrate 102. In practice, due to etch-loading effects, the gates 101 may not all be formed to the same uniform height as depicted in the drawings, but such non-uniformity in height is not depicted so as not to overly complicate the drawings. Of course, after a complete reading of the present application, those skilled in the art will appreciate that the methods disclosed herein may be employed on an IC product 100 comprised of any type of semiconductor device, e.g., FinFET devices, planar transistor devices, and it may be employed where the gate structures where the devices are formed using so-called gate first manufacturing techniques as well as cases where the gate structures are manufactured using so-called replacement gate manufacturing techniques. In the illustrative example depicted herein, the final gate structures for the devices will be formed using a replacement gate manufacturing technique, but the inventions recited in the claims should not be considered to be limited only to the disclosed examples depicted herein.

With continuing reference to FIG. 2A, the product 100 may comprise either NMOS transistors, PMOS transistors or both types of transistors. Additionally, various doped regions, e.g., source/drain extension implant regions, halo implant regions, well regions and the like, are not depicted in the attached drawings. The substrate 102 may have a variety of configurations, such as the depicted bulk semiconductor (e.g., silicon) configuration. The substrate 102 may also have a semiconductor-on-insulator (SOI) configuration that includes a bulk semiconductor layer, a buried insulation layer and an active layer, wherein semiconductor devices are formed in and above the active layer. The substrate 102 may be made of silicon or it may be made of semiconductor materials other than silicon. Thus, the terms "substrate" or "semiconductor substrate" should be understood to cover all semiconductor materials and all forms of such materials.

FIG. 2A depicts the product 100 at a point in fabrication wherein several process operations were performed. First, the isolation structure 103 was formed in the substrate 102. Thereafter, the material for the sacrificial gate structures 104 was formed across the substrate 102. In one illustrative embodiment, each of the sacrificial gate structures 104 comprises a sacrificial gate insulation layer (not separately shown), such as a layer of silicon dioxide (formed by deposition or by thermal growth), and a layer of sacrificial gate material, such as amorphous silicon or polysilicon. Next, a tri-layer patterned gate etch mask 106 was formed above the layer of sacrificial gate material. In the example depicted herein, the patterned gate etch mask 106 comprises the first layer 106A, a second layer 106B and a third layer 106C. In one embodiment, the layer 106B is made of a material that is selectively etchable relative to the materials of the layers 106A, 106C. In some applications, the layers 106A, 106C may be made of the same material, but that situation may not be required in all applications. The materials used for the layers 106A-C and the thicknesses of each of the layers 106A-C may vary depending upon the particular application. In one illustrative embodiment, the layer 106A may be a layer of silicon dioxide having a thickness of about 15-20 nm, the layer 106B may be a layer of silicon nitride having a thickness of about 25-30 nm and the layer 106C may be a layer of silicon dioxide having a thickness of about 30-40 nm. The patterned gate etch mask 106 was formed by blanket-depositing the materials for the layers 106A, 106B and 106C sequentially above the substrate 102. Thereafter, the three layers of material were patterned to define the patterned gate etch mask 106 by performing one or more etching processes through a patterned masking layer (not shown), e.g., a patterned layer of photoresist, anti-reflective coating layer and a planarizing layer, etc., that was formed above the substrate 102 using known photolithography tools and techniques. Next, one or more etching processes, e.g., anisotropic processes, was performed through the patterned gate etch mask 106 to define the plurality of sacrificial gate structures 104.

With continuing reference to FIG. 2A, after the formation of the sacrificial gate structures 104, a sidewall spacer 105 was formed adjacent each of the sacrificial gate structures 104. The sidewall spacer 105 was formed by performing a conformal deposition process to form a conformal layer of spacer material above the substrate 102 and thereafter performing an anisotropic etching process. The lateral width of the spacer 105 at its base may vary depending upon the particular application. In one illustrative example, the spacer 105 may be comprised of a material such as, for example, silicon nitride, and it may also be a material that is selectively etchable with respect to the material of the layer 106A. After formation of the spacers 105, optional regions of epi semiconductor material were formed in the source/drain regions of the transistor devices so as to define illustrative raised epi source/drain regions 114. However, the raised epi source/drain regions 114 need not be formed in all applications. Next, a conformal insulating liner layer 107 was formed across the product 100 by performing a conformal deposition process. The liner layer 107 may be comprised of one or more layers of material. In one illustrative embodiment, the liner layer 107 may be comprised of a material such as silicon nitride, and it may have a thickness on the order of about 2-5 nm. The liner layer 107 may also be formed of a material that is selectively etchable relative to the material of the layer 106A. A layer of insulating material 110, e.g. silicon dioxide, was deposited above the substrate 102 between the laterally spaced apart gates 101.

Figure 2B:
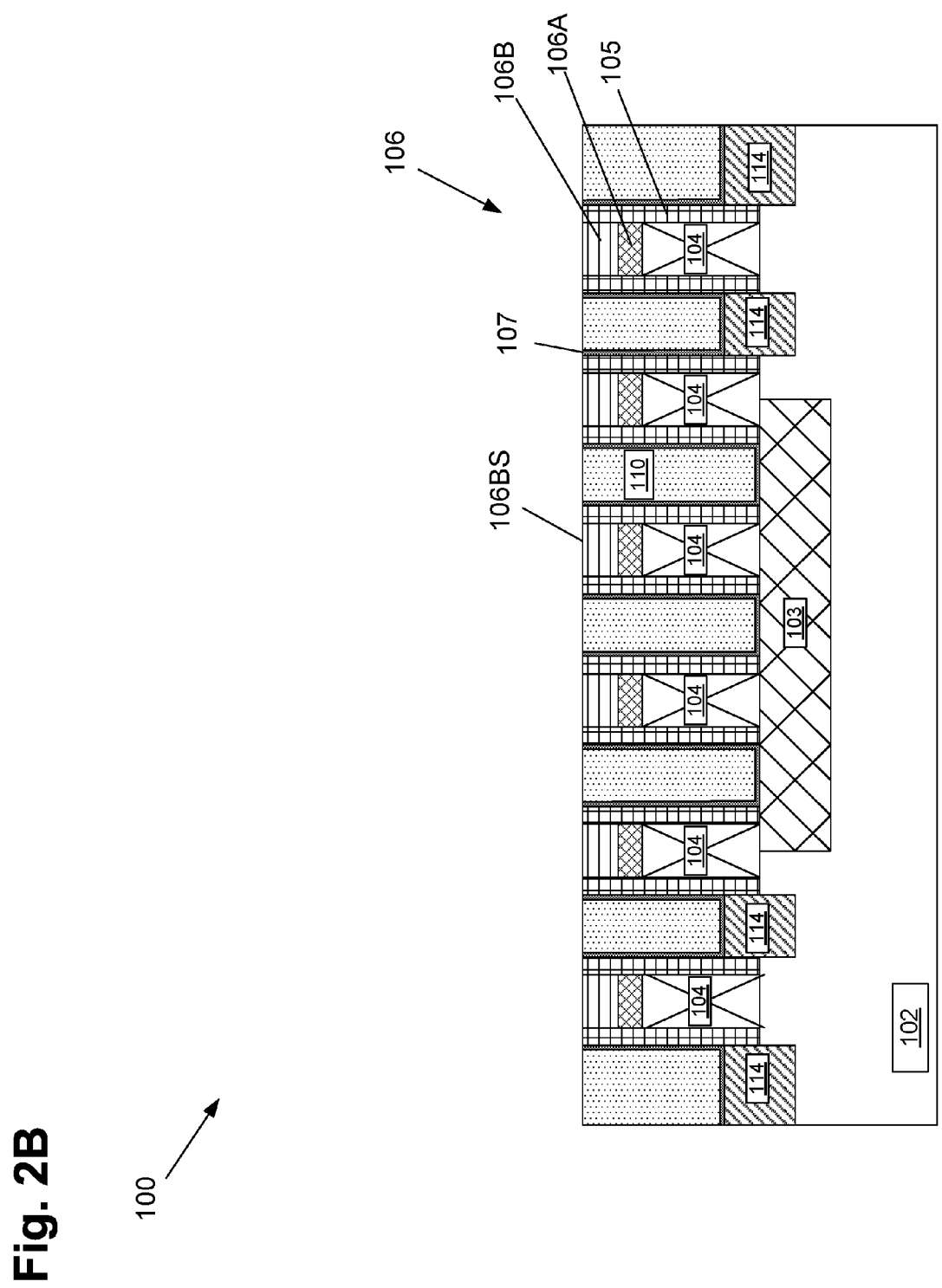

FIG. 2B depicts the product 100 after a planarization process (e.g., a chemical mechanical planarization (CMP) process) was performed on the layer of insulating material 110 using the layer 106B as a polish-stop. This process operation removes the upper-most layer 106C of the tri-layer patterned gate etch mask 106 and exposes the upper surface 106BS of the layer 106B of the tri-layer patterned gate etch mask 106.

Figure 2C:
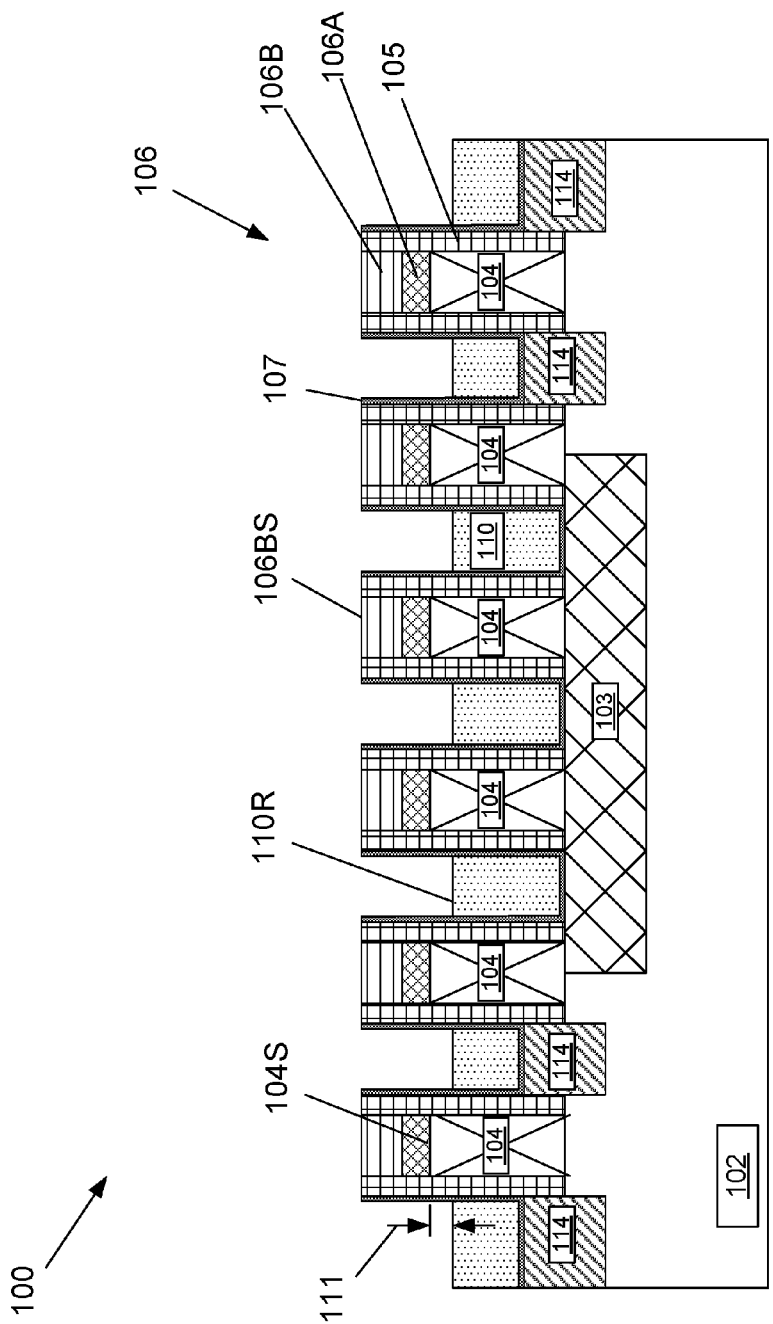

FIG. 2C depicts the product 100 after a timed recess etching process was performed to remove a portion of the thickness of the layer of insulating material 110. The recess etching process was performed for a sufficient duration such that, after the recess etching process is completed, a recessed upper surface 110R of the layer of insulating material 110 is positioned at a level that is below the level of the upper surface 104S of the sacrificial gate structures 104 by a distance 111 that may be on the order of about 10-30 nm.

Figure 2D:
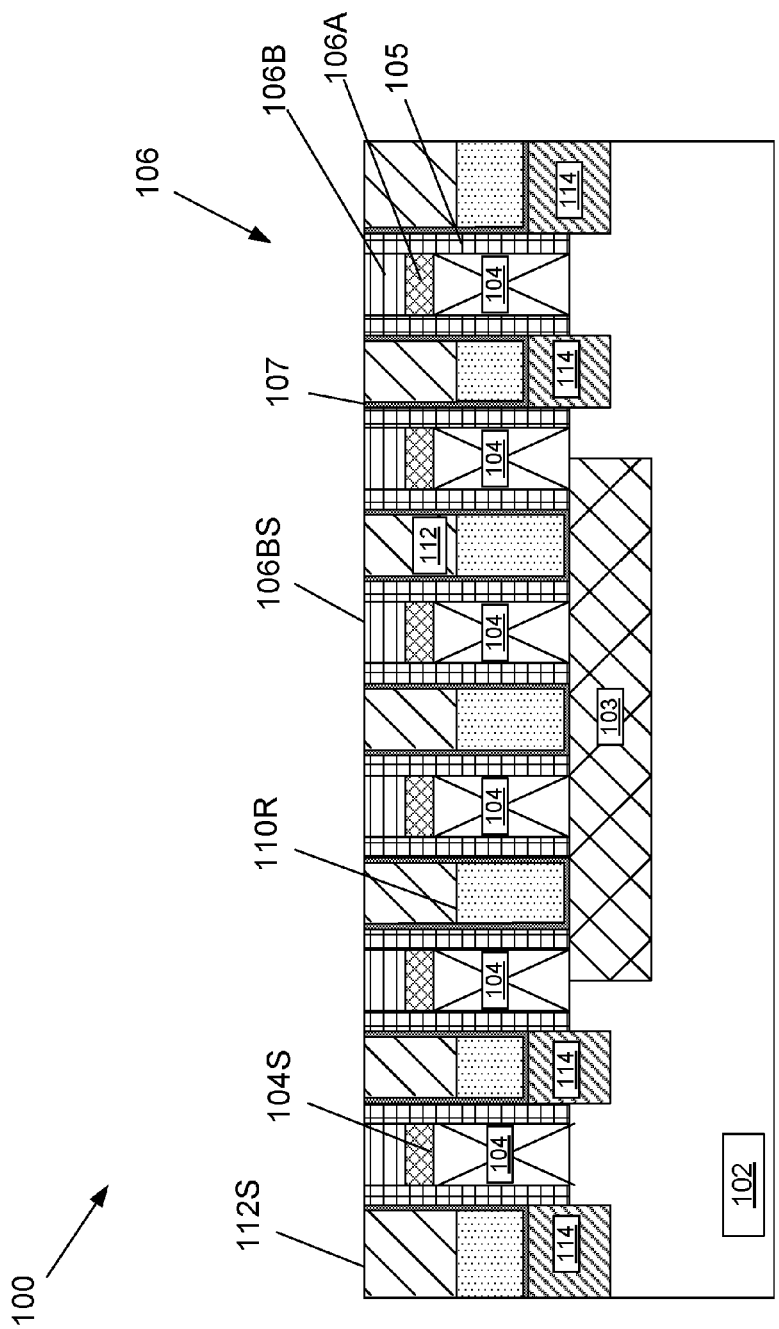

FIG. 2D depicts the product 100 after several process operations were performed. First, another layer of insulating material 112, e.g., an HDP layer of silicon dioxide, was formed above the substrate 102 and the recessed layer of insulating material 110R. Thereafter, a planarization process (e.g., CMP) was performed on the layer of insulating material 112 using the layer 106B as a polish-stop, such that the upper surface 112S is substantially planar with the upper surface 106BS of the tri-layer patterned gate etch mask 106.

Figure 2E:
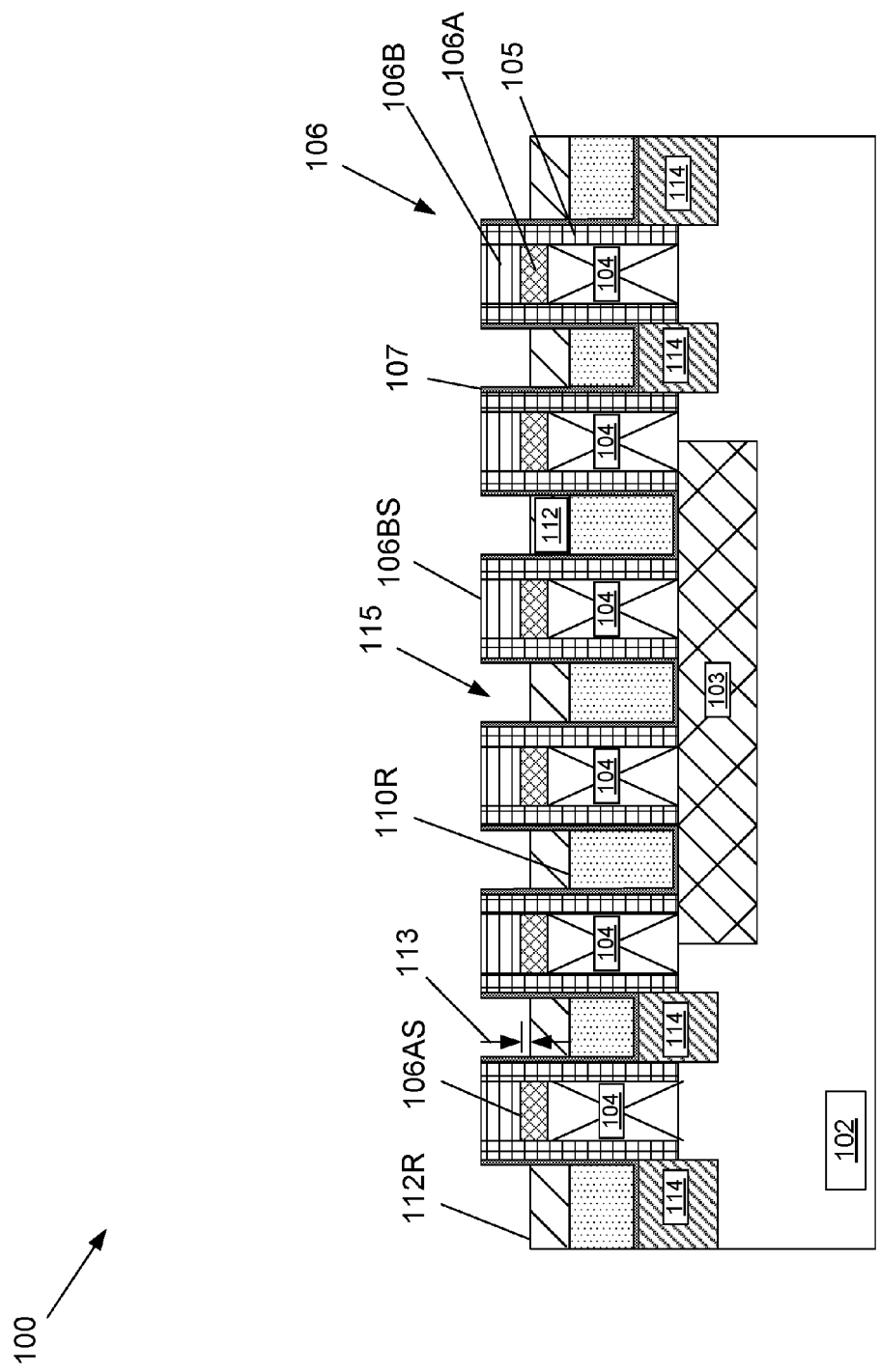

FIG. 2E depicts the product 100 after another timed recess etching process was performed to remove a portion of the thickness of the layer of insulating material 112. The recess etching process was performed for a sufficient duration such that, after the recess etching process is completed, a recessed upper surface 112R of the layer of insulating material 112 is positioned at a level that is below the level of the upper surface 106AS of the layer 106A of the tri-layer patterned gate etch mask 106 by a distance 113 that may be on the order of about 5-20 nm. This process operation results in the formation of a plurality of recesses 115 between the gates 101 on the product 100.

Figure 2F:
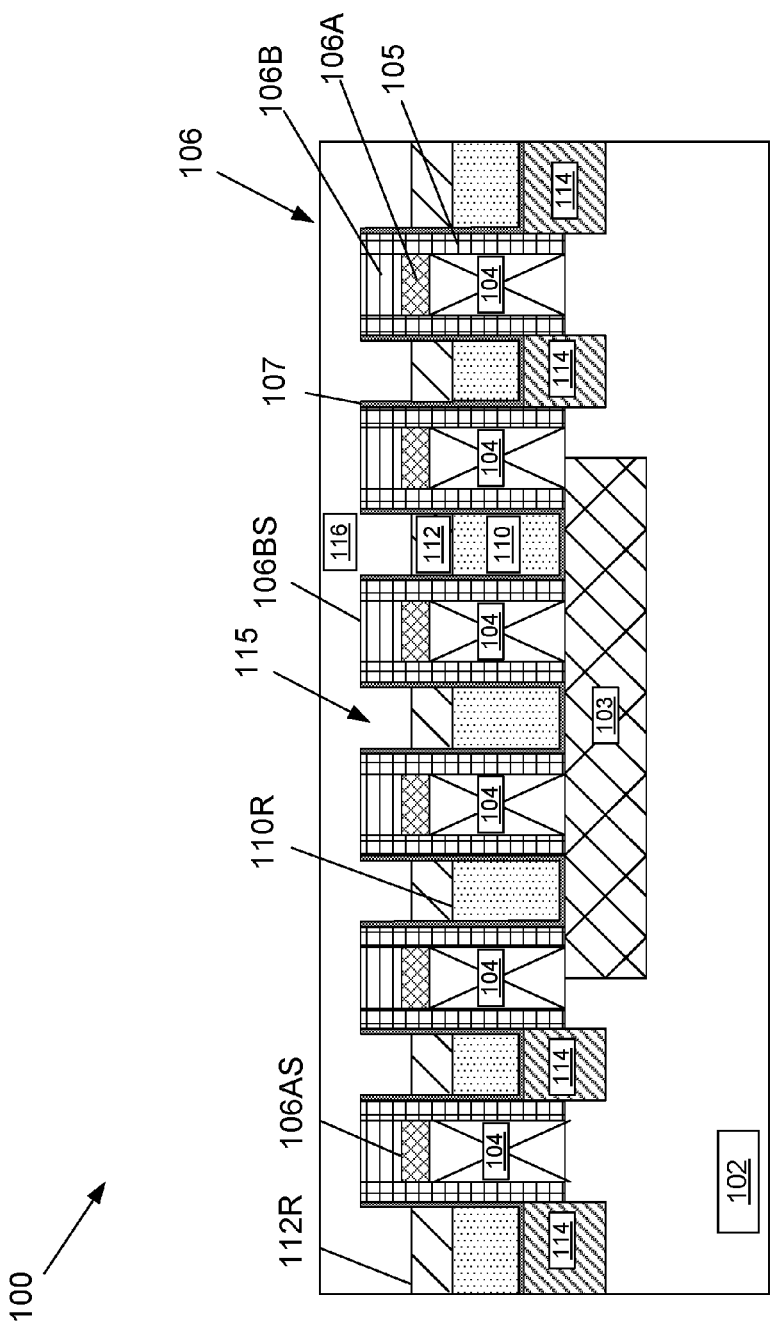

FIG. 2F depicts the product 100 after another layer of a protective insulating material 116, e.g., silicon nitride (or a material that is selectively etchable relative to the material of the layer 106A) was formed above the product so as to over-fill the recesses 115. As depicted, the protective layer 116 is formed above the insulating materials 110, 112 that are positioned above the substrate 102 between the spaced apart gates 101.

Figure 2G:
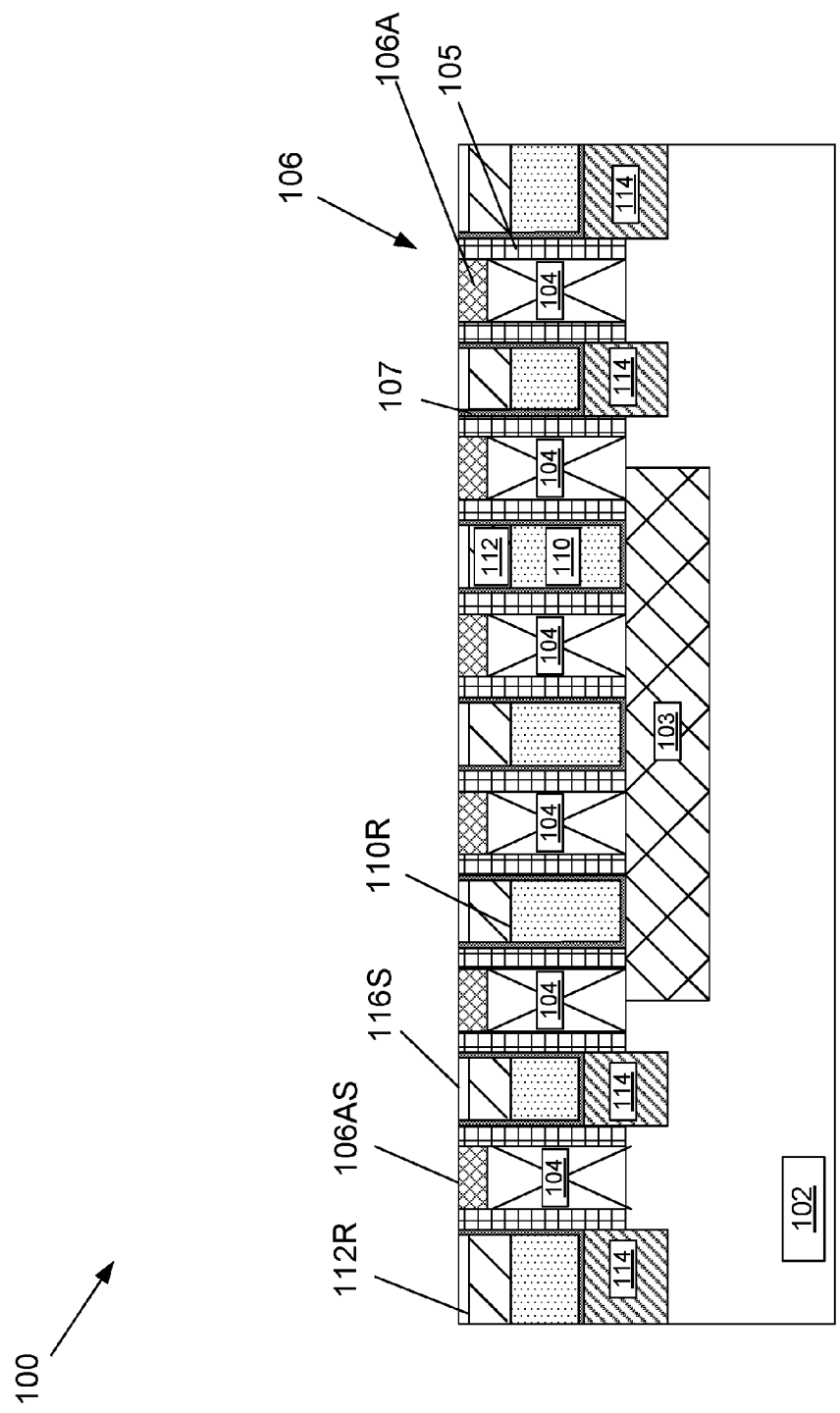

FIG. 2G depicts the product 100 after a planarization process (e.g., CMP) was performed on the layer of insulating material 116 using the layer 106A as a polish-stop. At the completion of the process, the upper surface 116S of the layer of insulating material 116 may be substantially co-planar with the upper surface 106AS of the layer 106A of the tri-layer patterned gate etch mask 106. Importantly, the remaining portions of the protective layer of insulating material 116 protect the underlying insulating materials 110, 112 that are positioned above the substrate 102 between the spaced apart gates 101.

Figure 2H:
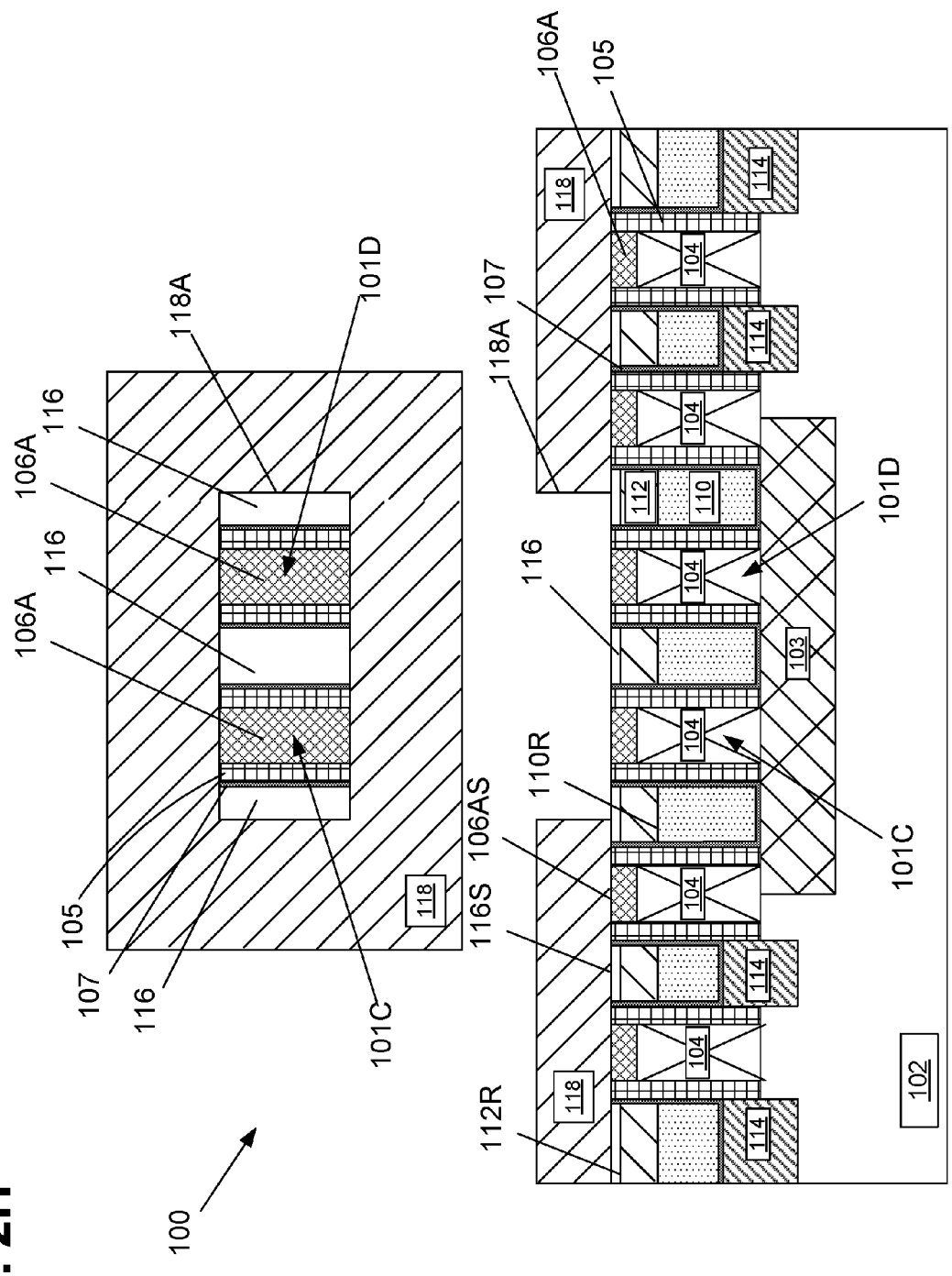

FIG. 2H depicts the product 100 after, a patterned etch mask 118, with an opening 118A defined therein was formed above the substrate 102. The patterned etch mask 118 may take a variety of forms and may be comprised of a variety of different materials, e.g., a layer of photoresist, an anti-reflective coating layer and a planarizing layer. The patterned etch mask 118 may be formed using known photolithography tools and techniques. FIG. 2H contains a simplistic plan view of the patterned etch mask 118. As depicted, the opening 118A in the patterned etch mask 118 is located above a portion of the axial length of the gates 101C, 101D (positioned above the isolation region 103) where it is desired to prevent the formation of a final gate structure for the completed devices. The opening 118A exposes portions of the layer 106A positioned above the gate structures 104 for the gates 101C, 101D. The opening 118A also exposes at least portions of the insulating material layer 116 adjacent the gates 101C, 101D. At this point, since the liner layer 107, the spacer 105 and the layer 116 may all be comprised of materials that are selectively etchable relative to the material of the layer 106A, the layer of material 106A may be selectively removed relative to surrounding materials. Also note that, due to the presence of the protective layer of material 116 protecting the underlying oxide materials 112, 110, there is a much wider process margin for accurately locating the opening 118A such that only the exposed portions of the layer 106A, e.g., silicon dioxide, can be selectively removed.

Figure 2I:
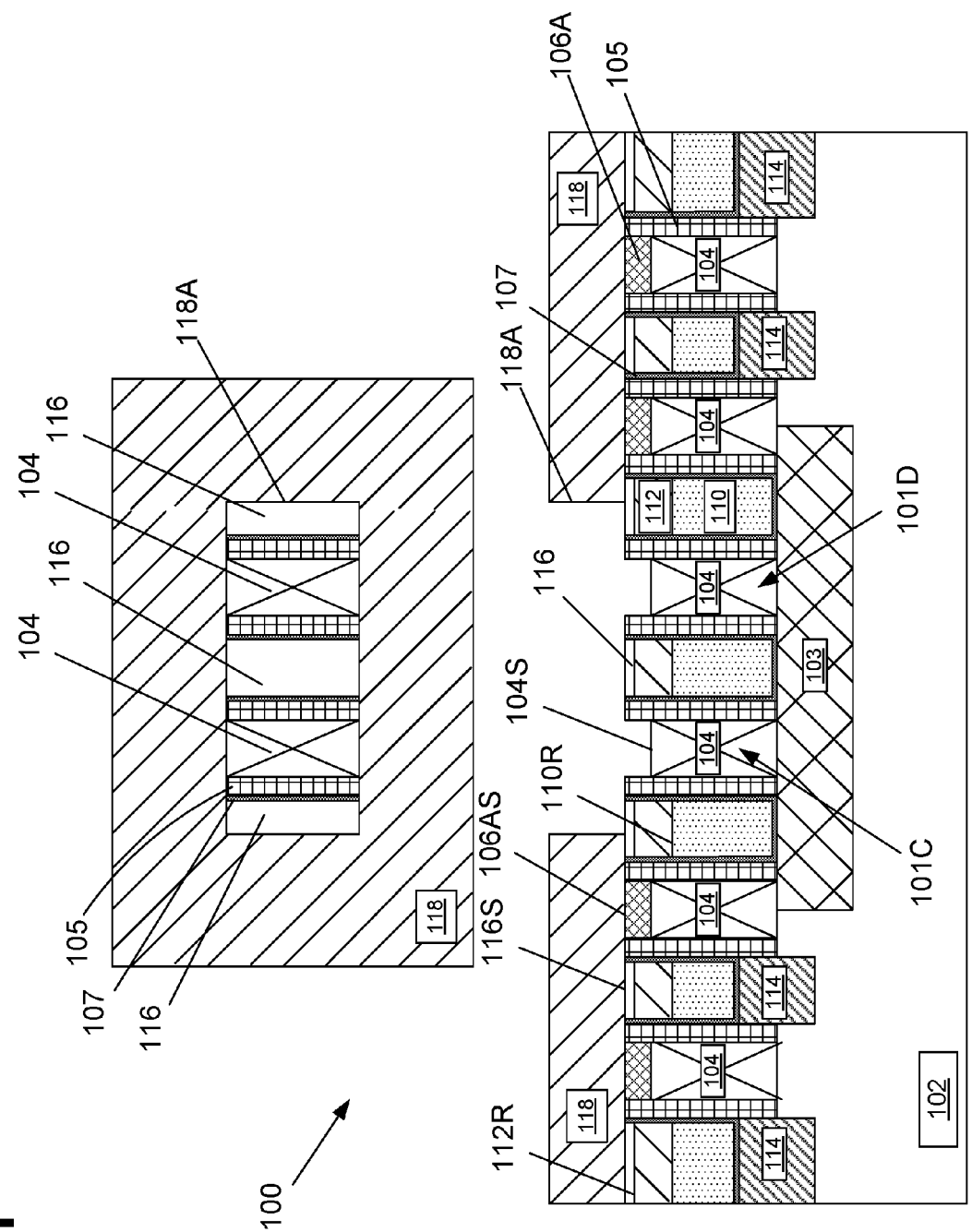

FIG. 2I depicts the product 100 after an etching process was performed through the patterned etch mask 118 to selectively remove the layer 106A relative to the surrounding materials. This process operation exposes the upper surface 104S of the axial portions of the sacrificial gate structures 104 positioned under the opening 118A in the patterned etch mask 118.

Figure 2J:
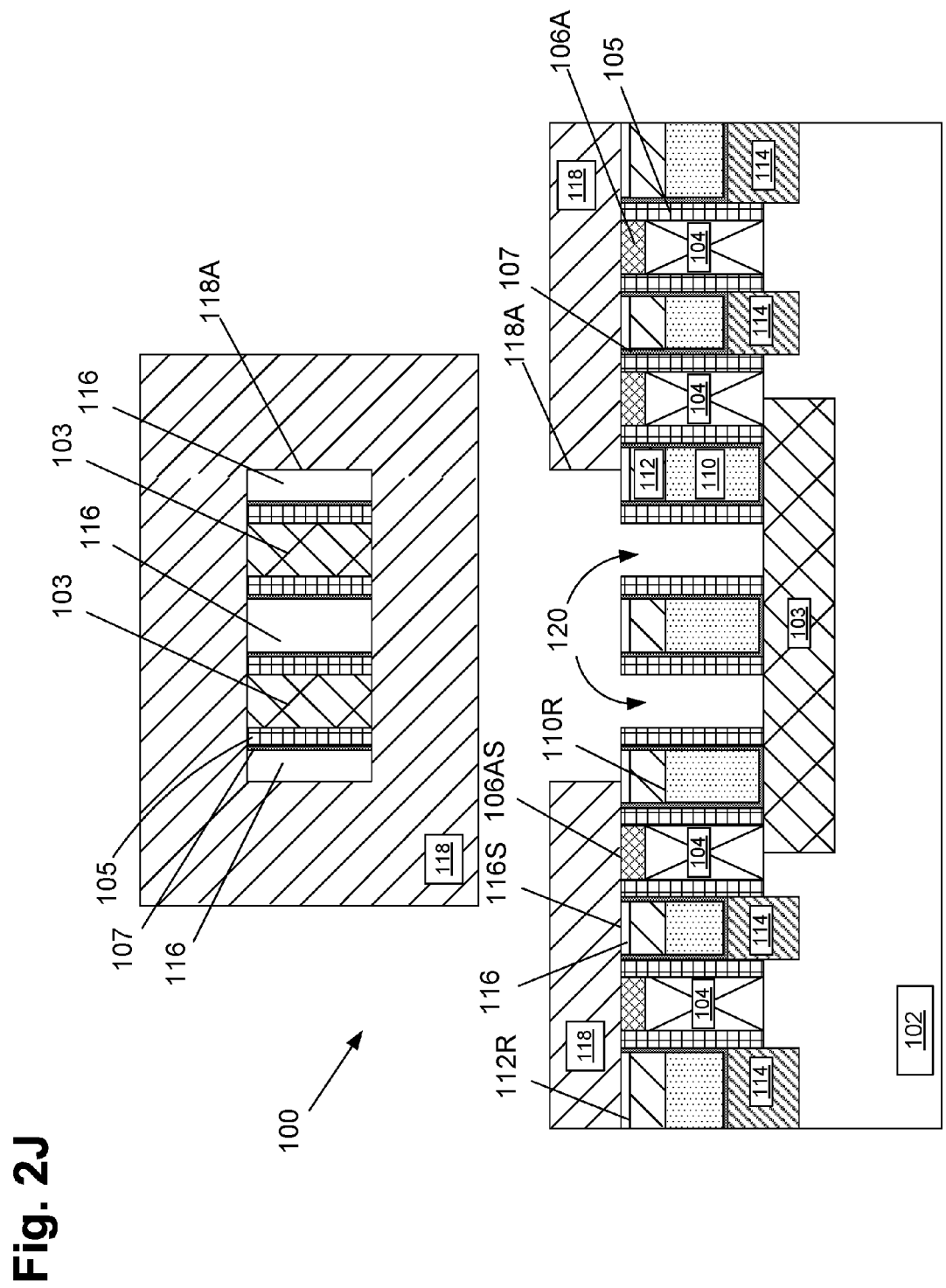

FIG. 2J depicts the product 100 after one or more anisotropic etching processes were performed through the patterned etch mask 118 to selectively remove the exposed portions of the sacrificial gate structures 104 for the gates 101C, 101D relative to the surrounding materials. This process operation results in the formation of a plurality of gate-cut cavities 120 that expose a portion of the isolation region 103 at the bottom of the gate-cut cavities 120.

Figure 2K:
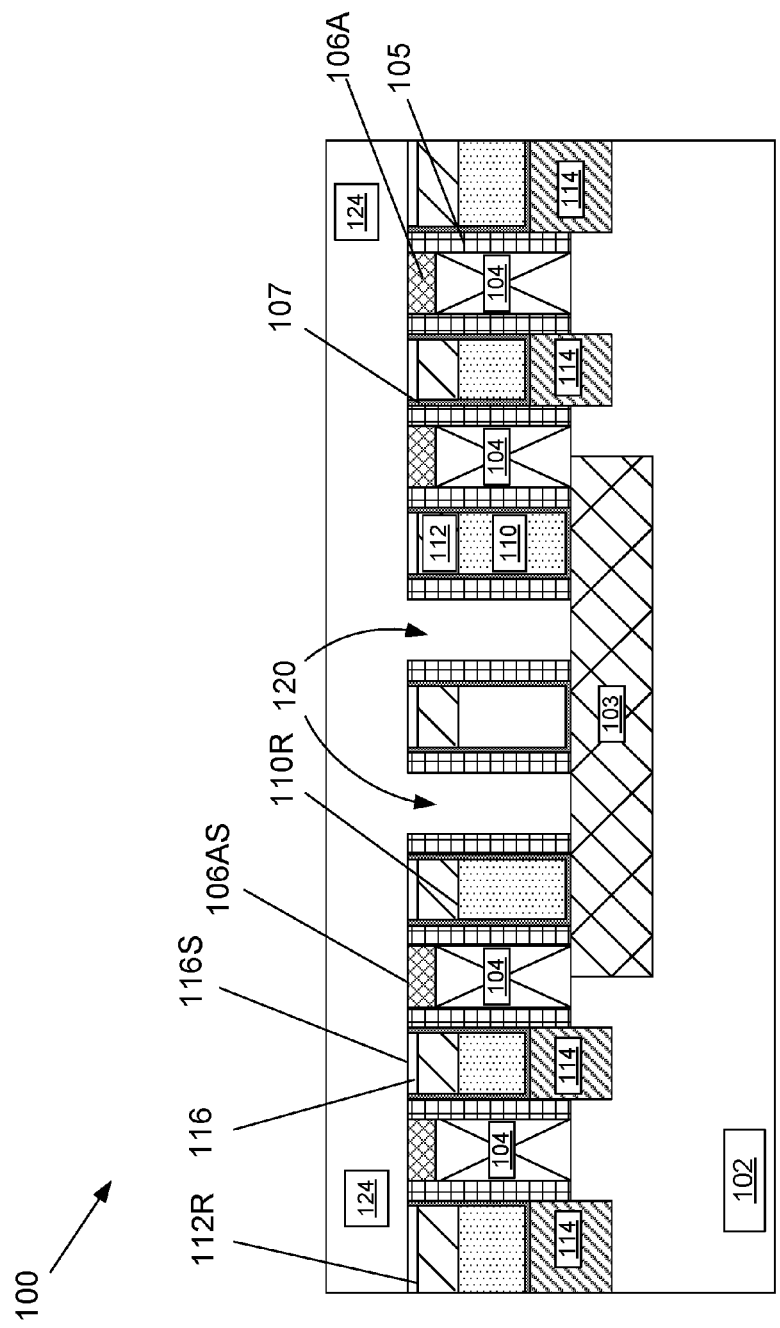

FIG. 2K depicts the product 100 after a layer of insulating material 124, e.g., silicon nitride, a material having a k value of less than 10, etc., was formed above the product so as to over-fill the gate-cut cavities 120. The layer of material 124 may also be made of a material that is selectively etchable relative to the material of the layer 106A.

Figure 2L:
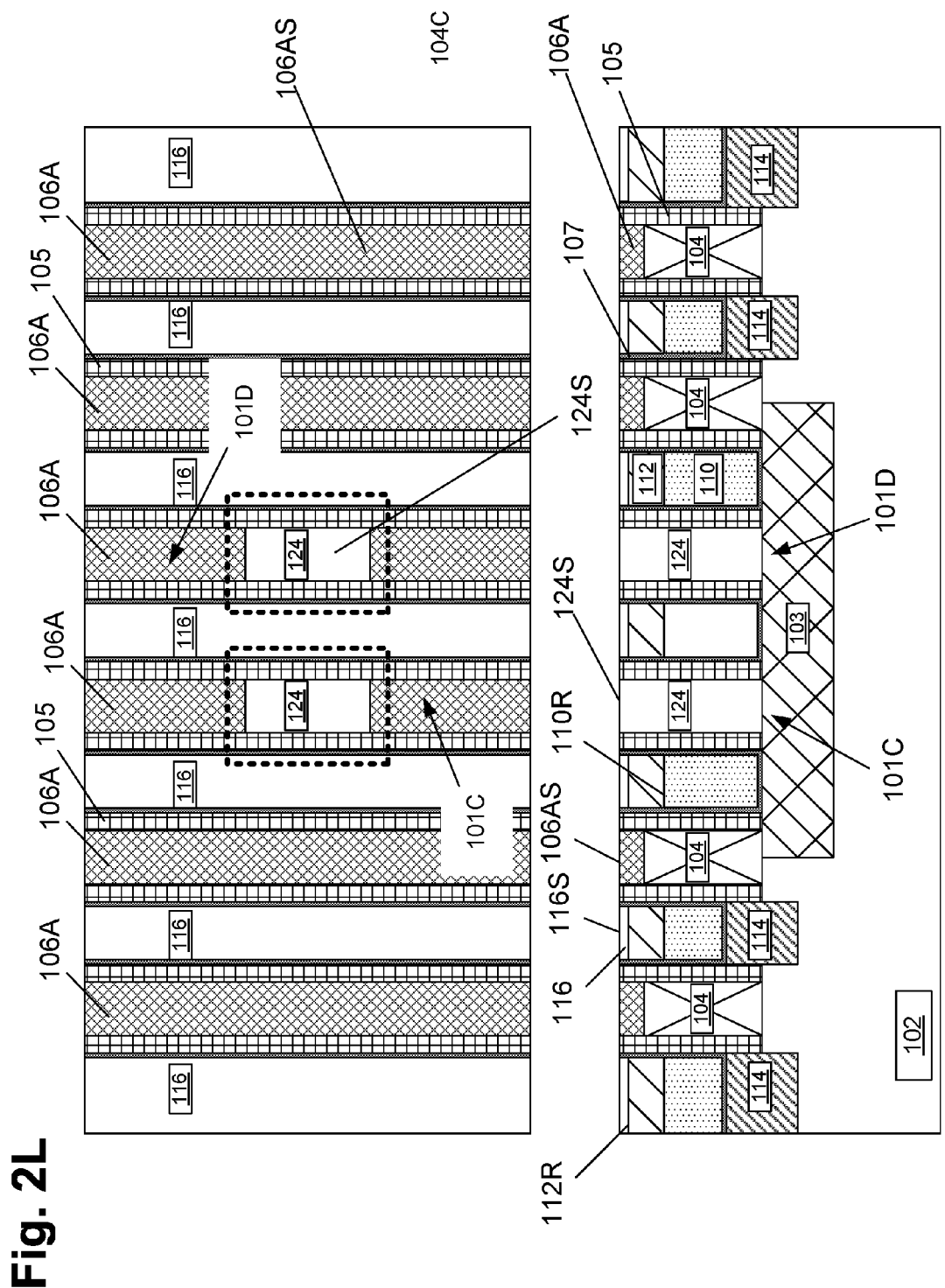

FIG. 2L depicts the product 100 after a planarization process (e.g., CMP) was performed on the layer of insulating material 124 using the layer 106A as a polish-stop. At the completion of the process, the upper surface 124S of the layer of insulating material 124 may be substantially co-planar with the upper surface 106AS of the layer 106A positioned above the gate structures 104. The simplistic plan view depicts the portions of the insulating material 124 (within the dashed-line regions) that effectively replaced the previously removed portions of the sacrificial gate structures 104 of the gates 101C and 101D. As described more fully below, the remaining portions of the insulating material 124 effectively constitute insulating gate-cut structures (comprised of a material having a k value less than 10) that are positioned within the gate-cut cavities 120 between the spacer 105. In the case of a replacement gate manufacturing process, the insulating gate-cut structures will prevent the formation of a final conductive gate structure in the areas occupied by the insulating gate-cut structures. In the case of a gate-first manufacturing process, the insulating gate-cut structures effectively separate the previously formed final gate structure into the desired axial segments. Note that, using the novel method disclosed herein, the insulating gate-cut structures are formed in a fully self-aligned manner (by virtue of the selective etchability of the various materials described above), which is advantageous in the event that the opening 118A in the patterned etch mask 118 might be misaligned to some degree.

Figure 2M:
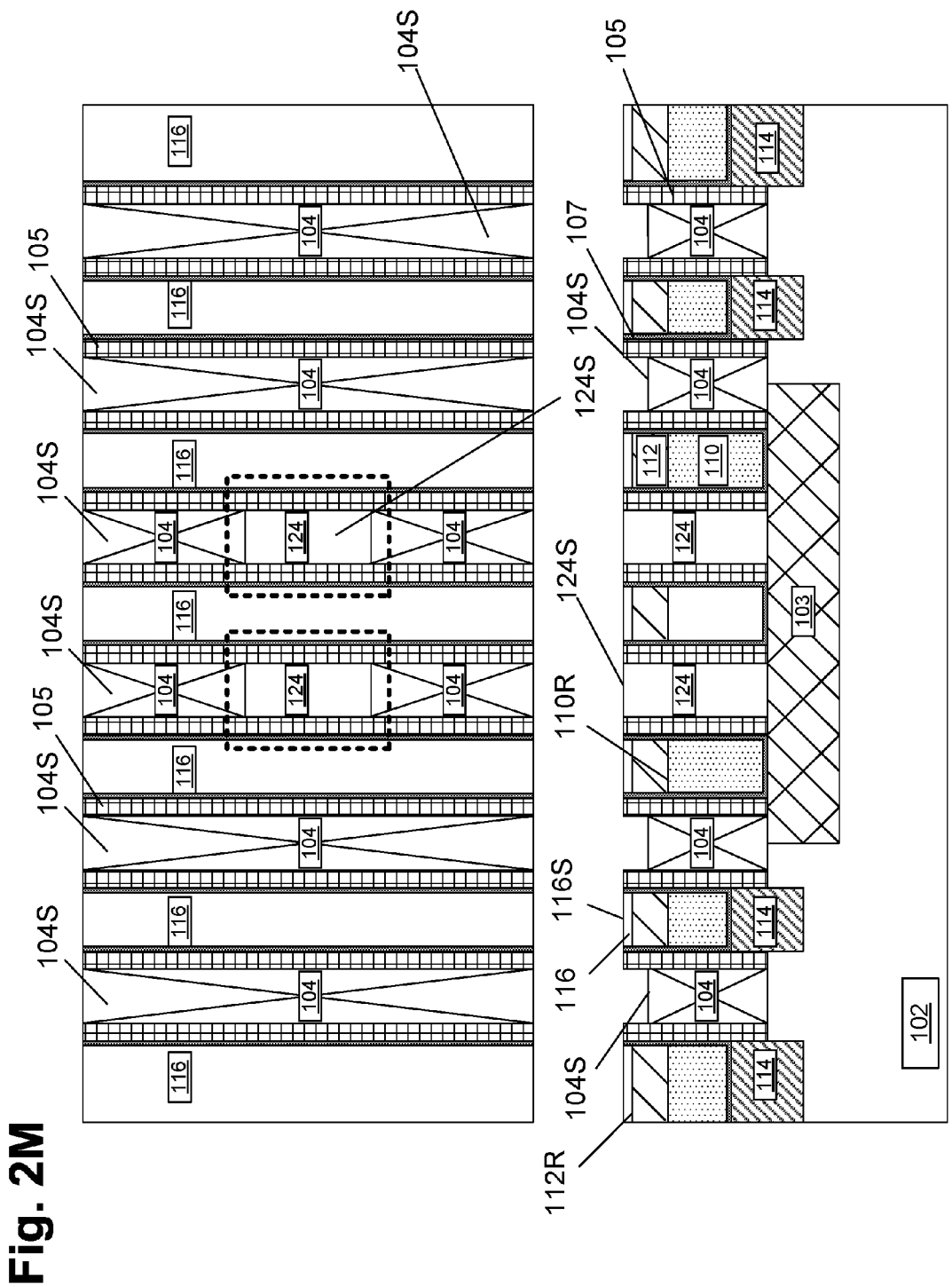

FIG. 2M depicts the product 100 after an etching process was performed to selectively remove the remaining portions of the layer 106A relative to the surrounding materials. This process operation exposes the upper surface 104S of the remaining portions of the sacrificial gate structures 104 for the gates 101A-F.

FIG. 2N depicts the product 100 after one or more etching processes were performed to selectively remove the remaining portions of the sacrificial gate structures 104 relative to the surrounding materials. This process operation results in the formation of a plurality of replacement gate cavities 128.

FIG. 2O depicts the product after illustrative and simplistically depicted replacement or final gate structures 130 were formed in the replacement gate cavities 128. Also depicted are gate cap structures 132. As depicted in the plan view in FIG. 2O, the insulating gate-cut structures 124 (within the dashed line regions) prevented the formation of the final gate structures 130 in the areas occupied by the insulating gate-cut structures 124.

The final gate structures 130 are intended to be representative in nature of any type of gate structure that may be employed in manufacturing integrated circuit products using so-called gate-first or gate-last (replacement-gate) manufacturing techniques. In general, the gate structures 130 may be comprised of one or more gate insulation layers 130A, such as, for example, silicon dioxide, a so-called high-k (k greater than 10) insulation material, etc., and one or more conductive material layers 130B that act as the gate electrode, e.g., a metal, a metal alloy, titanium nitride, tantalum nitride, tungsten, aluminum, polysilicon, etc. In one example, after the gate structures 104 were removed, a conformal chemical vapor deposition (CVD) or atomic layer deposition (ALD) process may be performed to conformably deposit the gate insulation layer 130A in the replacement gate cavities 128. Thereafter, one or more metal or metal alloy layers and/or polysilicon layers (that will become the gate electrode 130B) may be deposited in the replacement gate cavities 128 above the gate insulation layer 130A. One or more CMP process operations were then performed to remove excess portions of the materials for the gate insulation layer 130A and the gate electrode 130B positioned outside the replacement gate cavities 128. Thereafter, a timed, recess etching process was performed to recess the gate structures 130 so as to thereby make room for the gate cap 132 to be formed in the replacement gate cavities 128 above the recessed final gate structures 130. The gate cap 132 was formed by depositing a layer of gate cap material, e.g., silicon nitride, across the substrate and thereafter performing a CMP process to remove the excess gate cap material.

After a complete reading of the present application, those skilled in the art will appreciate that the methods disclosed provide a means for forming a protective layer 116 above underlying insulation material (112, 110) from a material that is selectively etchable relative to the layer 106A that protects the gate structures 104. This method allows a larger process window for the formation of the gate-cut mask opening 118A in that the opening may be made larger than similar openings in prior art gate-cut masks without fear of attacking the insulating materials (110, 112) positioned between the gates 101. The present methods are also able to accommodate situations where the opening 118A is misaligned (like the opening 124A shown in FIGS. 1B-1C in the background section of this application) given the presence of the protective layer 116 positioned between the adjacent gates 101.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. Accordingly, the protection sought herein is as set forth in the claims below.

What is claimed:

1. A method, comprising:
    forming a plurality of laterally spaced apart continuous line-type gates above a semiconductor substrate, each of said gates comprising a gate structure and a first layer of a first insulating material positioned on an upper surface of said gate structure;
    forming a second layer of a second insulating material above a third insulating material positioned above said substrate between said laterally spaced apart gates, wherein said first insulating material and said second insulating material are selectively etchable relative to one another;
    performing at least one first etching process to selectively remove a portion of said first layer relative to portions of said second layer so as to thereby expose a portion of an axial length of said gate structure of at least one of said plurality of gates;
    performing at least one second etching process to selectively remove said exposed axial portion of said gate structure of said at least one of said plurality of gates so as to thereby define a gate-cut cavity; and
    forming an insulating gate-cut structure in said gate-cut cavity.

2. The method of claim 1, wherein said first insulating material comprises silicon dioxide and said second insulating material comprises silicon nitride.

3. The method of claim 1, wherein forming said plurality of laterally spaced apart continuous line-type gates comprises:
    forming a tri-layer patterned gate etch masking layer above one or more layers of gate material for said gate structures, said tri-layer patterned gate etch masking layer comprising a lowermost layer, a middle layer and an uppermost layer, said lowermost layer being positioned on and in contact with an upper layer of said one or more layers of gate material, said middle layer being positioned on and in contact with said lowermost layer and said uppermost layer being positioned on and in contact with said middle layer; and
    performing at least one third etching process through said tri-layer patterned gate etch masking layer to pattern said one or more layers of gate material to thereby define a gate structure for each of said plurality of gates, wherein said lowermost layer of said tri-layer patterned gate etch masking layer is said first layer of insulating material.

4. The method of claim 3, wherein said lowermost layer, said middle layer and said uppermost layer of said tri-layer patterned gate etch masking layer comprise, respectively, silicon dioxide, silicon nitride and silicon dioxide.

5. The method of claim 3, further comprising:
    depositing a third layer of said third insulating material above and between said plurality of gates; and
    performing a first planarization process to planarize an upper surface of said third layer of said third insulating material, wherein an upper surface of said middle layer of said tri-layer patterned gate etch masking layer is exposed after said first planarization process is completed;
    performing a recess etching process on said planarized third layer of said third insulating material such that, after said recess etching process is completed, a recessed upper surface of said third layer of said third insulating material is positioned at a level that is below a level of an upper surface of said lowermost layer of said tri-layer patterned gate etch masking layer and a recess is defined between adjacent gates of said plurality of gates above said recessed upper surface of said third layer of said third insulating material;
    depositing a layer comprising said second insulating material above said gates so as to over-fill said recesses between said adjacent gates; and
    performing a second planarization process to planarize an upper surface of said layer comprising said second insulating material, wherein an upper surface of said lowermost layer of said tri-layer patterned gate etch masking layer is exposed after said second planarization process is completed and wherein remaining portions of said second insulating material constitute said second layer of said second insulating material.

6. The method of claim 1, wherein said gate structure of each of said plurality of gates comprises a final gate structure for a transistor device.

7. The method of claim 1, further comprising:
    removing remaining portions of said first layer adjacent said insulating gate-cut structure so as to expose a gate structure positioned adjacent opposite sides of said insulating gate-cut structure;
    removing said exposed gate structure while leaving said insulating gate-cut structure in position, wherein said removal of said exposed gate structure defines at least one replacement gate cavity; and
    forming a replacement gate structure in said at least one replacement gate cavity.

8. A method, comprising:
    forming one or more layers of gate material above a semiconductor substrate;
    forming a tri-layer patterned gate etch mask above said one or more layers of gate material, said tri-layer patterned gate etch mask comprising a lowermost layer that comprises a first insulating material;
    performing at least one first etching process through said tri-layer patterned gate etch mask to pattern said one or more layers of gate material to thereby define a continuous line-type gate structure for each of a plurality of laterally spaced apart continuous line-type gates, wherein a portion of said lowermost layer is positioned on an upper surface of each of said gate structures;
    forming a second layer of a second insulating material above a third insulating material positioned above said substrate between said laterally spaced apart gates, wherein said first insulating material and said second insulating material are selectively etchable relative to one another and wherein an upper surface of said second layer is substantially planar with an upper surface of said lowermost layer on each of said gate structures;

performing at least one first etching process to selectively remove a portion of said lowermost layer relative to portions of said second layer so as to thereby expose a portion of an axial length of said gate structure of at least one of said plurality of gates;

performing at least one second etching process to selectively remove said exposed axial portion of said gate structure of said at least one of said plurality of gates so as to thereby define a gate-cut cavity; and forming an insulating gate-cut structure in said gate-cut cavity.

9. The method of claim 8, wherein said lowermost layer comprises silicon dioxide and said second insulating material comprises silicon nitride.

10. The method of claim 8, wherein said tri-layer patterned gate etch mask further comprises a middle layer that is positioned on and in contact with said lowermost layer and an uppermost layer that is positioned on and in contact with said middle layer.

11. The method of claim 10, wherein said lowermost layer, said middle layer and said uppermost layer of said tri-layer patterned gate etch mask comprise, respectively, silicon dioxide, silicon nitride and silicon dioxide.

12. The method of claim 8, wherein forming said second layer comprises:

depositing a layer comprising said second insulating material above said gates; and performing a planarization process to planarize an upper surface of said layer comprising said second insulating material, wherein an upper surface of said lowermost layer of said tri-layer patterned gate etch mask is exposed after said planarization process is completed and wherein remaining portions of said second insulating material constitute said second layer of said second insulating material.

13. The method of claim 8, further comprising:

removing remaining portions of said lowermost layer adjacent said insulating gate-cut structure so as to expose a gate structure positioned adjacent opposite sides of said insulating gate-cut structure;

removing said exposed gate structure while leaving said insulating gate-cut structure in position, wherein said removal of said exposed gate structure defines at least one replacement gate cavity; and forming a replacement gate structure in said at least one replacement gate cavity.

14. A method, comprising:

forming one or more layers of gate material above a semiconductor substrate;

forming a tri-layer patterned gate etch mask above said one or more layers of gate material, said tri-layer patterned gate etch mask comprising a lowermost layer that comprises a first insulating material, a middle layer and an uppermost layer, said lowermost layer being positioned on and in contact with an upper layer of said one or more layers of gate material, said middle layer being positioned on and in contact with said lowermost layer and said uppermost layer being positioned on and in contact with said middle layer;

performing at least one first etching process through said tri-layer patterned gate etch mask to pattern said one or more layers of gate material to thereby define a gate structure for each of a plurality of laterally spaced apart continuous line-type gates, wherein a portion of said lowermost layer is positioned on an upper surface of each of said gate structures;

forming a second layer of a second insulating material above a third insulating material positioned above said substrate between said laterally spaced apart gates, wherein said first insulating material and said second insulating material are selectively etchable relative to one another and wherein forming said second layer comprises:

depositing said second insulating material above and between said plurality of gates; and performing a planarization process to planarize an upper surface of said second insulating material, wherein an upper surface of said lowermost layer of said tri-layer patterned gate etch mask is exposed after said planarization process is completed;

forming a gate-cut mask with an opening that exposes said lowermost layer above a portion of at least one of said plurality of gates and at least a portion of said second layer on opposite sides of said at least one of said plurality of gates;

selectively removing said exposed portion of said lowermost layer relative to exposed portions of said second layer so as to thereby expose a portion of an axial length of said gate structure of said at least one of said plurality of gates;

selectively removing said exposed axial portion of said at least one of said plurality of gates so as to thereby define a gate-cut cavity; and forming an insulating gate-cut structure in said gate-cut cavity.

15. The method of claim 14, wherein said first insulating material comprises silicon dioxide and said second insulating material comprises silicon nitride.

16. The method of claim 14, wherein said lowermost layer, said middle layer and said uppermost layer of said tri-layer patterned gate etch mask comprise, respectively, silicon dioxide, silicon nitride and silicon dioxide.

17. The method of claim 14, wherein said gate structure of each of said plurality of gates comprises a final gate structure for a transistor device.

18. The method of claim 14, further comprising:

removing remaining portions of said lowermost layer adjacent said insulating gate-cut structure so as to expose a gate structure positioned adjacent opposite sides of said insulating gate-cut structure;

removing said exposed gate structure while leaving said insulating gate-cut structure in position, wherein said removal of said exposed gate structure defines at least one replacement gate cavity; and forming a replacement gate structure in said at least one replacement gate cavity.

* * * * *